United States Patent [19]
Rector

[11] Patent Number: 5,215,476
[45] Date of Patent: Jun. 1, 1993

[54] INTERFACE CONNECTOR ASSEMBLY

[75] Inventor: Lewis T. Rector, Winston-Salem, N.C.

[73] Assignee: Mac Panel Company, High Point, N.C.

[21] Appl. No.: 718,785

[22] Filed: Jun. 21, 1991

[51] Int. Cl.$^5$ ............................................. H01R 13/62
[52] U.S. Cl. ................................... 439/311; 439/314; 439/680
[58] Field of Search ........................... 439/310–312, 439/314, 316, 259, 680

[56] References Cited

U.S. PATENT DOCUMENTS

| | | |
|---|---|---|
| 2,699,534 | 1/1955 | Klostermann .................. 439/680 |
| 2,984,811 | 5/1961 | Hennessey et al. .............. 439/314 |
| 3,156,513 | 11/1964 | Peterson et al. ................ 439/680 |
| 4,239,315 | 12/1980 | Lacaze, Jr. ...................... 439/312 |
| 4,415,213 | 11/1983 | Punako et al. ................... 439/314 |
| 4,468,078 | 8/1984 | Frear et al. ...................... 439/314 |
| 4,707,046 | 11/1987 | Strand ............................. 439/314 |

Primary Examiner—Gary F. Paumen
Assistant Examiner—Hien D. Vu
Attorney, Agent, or Firm—Shefte, Pinckney & Sawyer

[57] ABSTRACT

An interface connector assembly for use in connecting a modular interchangeable test adaptor to a receiver for testing of electronic circuitry connected thereto utilizing a cylindrical cam to drive the interchangeable test adaptor in and out of mating relation with the receiver.

11 Claims, 6 Drawing Sheets

INTERFACE CONNECTOR ASSEMBLY

BACKGROUND OF THE INVENTION

The present invention relates to an interface connector assembly and more particularly to an interface connector assembly having mechanical means to effect interconnecting of a modular interchangeable test adaptor to a receiver for testing of electronic circuitry connected to the interchangeable test adaptor by test equipment connected to the receiver.

Over the past several years, electronic components, such as transistors, diodes, operational amplifiers, capacitors and inductors, have become increasingly smaller. As a result of this miniaturization, it has become convenient to arrange circuits on nonconducting circuit boards. Current levels of miniaturization have resulted in thousands of components existing within a single microchip whereas a circuit board might contain several to several dozen microchips. A problem associated with this miniaturization is a decline in the ability to individually test components for quality control or for suspected failure.

In the past, a technician might apply test leads to an individual component to determine its operational status. However, due to miniaturization, individual components are likely unavailable and even if they were available would be too small for the application of conventional test leads thereto. As a consequence, it became necessary to access components through their electrical leads or "runs" on a circuit board. This often involved injecting a signal at the proper location on the contacts of a circuit board and measuring the output thereof. As miniaturization increased, it became increasingly difficult to apply proper test signals to proper locations on an extensively equipped circuit board.

As a consequence, interface receivers have been developed which provide an interchangeable test adaptor on which can be mounted a circuit board or circuit boards. The interchangeable test adaptor is designed to mate with a receiver, the receiver being wired to various pieces of electronic test equipment. The interchangeable test adaptor can be wired to provide various configurations of signal inputs to the circuit board under test and can be custom made for specialized applications and designed to mate with a standard receiver. When a circuit board is mounted to an interchangeable test adaptor which is in turn mounted to a receiver, various options are open to the operator. The operator can input diagnostic programs or various levels of electrical pulses or signals through either the mounted circuit board connector blocks or through jumper wires attached to both the circuit board and to electrical connectors in the interchangeable test adaptor.

Difficulties soon arose when it became necessary to mount interchangeable test adaptors into receivers which involved several hundred to several thousand connectors. When joining even two electrical connectors, a certain amount of force must necessarily be applied to overcome the natural resistiveness of the connectors being placed in a mating relation. If this force is multiplied by several hundred or several thousand connectors, it becomes difficult if not impossible to manually install an interchangeable test adaptor into a receiver base to insure proper electrical connection of all connectors involved without applying some mechanical advantage.

Mechanical devices have been developed to aid in making the connection of an adaptor to a receiver base. In this regard, typical receivers and interchangeable test adaptors are rectangular in shape. To provide the necessary mating force, it became necessary for those practicing in this art to construct elaborate handle operated gear or cam mechanisms wherein an operator would pull or push a handle on the end of a lever arm which would in turn operate some form of gear or cam drive to force the interchangeable test adaptor into mating relation with the receiver. A typical example of this prior art approach is disclosed in U.S. Pat. No. 4,213,666 which provides an elaborate hand operated roll cam bar mechanism which, with sufficient force applied, will pull an interchangeable test adaptor into mating relation with a receiver. Disadvantages with this type of mechanism include complicated construction to obtain the mechanical advantage necessary to effect connection and in doing so converting arcuate movement of an operating lever into linear movement of the interchangeable test adaptor. Additionally, the complicated mechanisms require a multiplicity of parts with attendant maintenance and repair problems. Further, the mechanisms require considerable space in addition to the space occupied by the connectors themselves.

SUMMARY OF THE INVENTION

It is accordingly an object of the present invention to provide an interface connector assembly which solves the aforementioned problems. More specifically, the present invention provides an interface connector assembly which utilizes rotary motion to effect engagement of an interchangeable test adaptor with a receiver thereby providing a mechanism which is far less mechanically complex, more compact, lighter, and simpler unit than has been previously known.

Briefly summarized, the present invention includes an interface connector assembly for use in interconnecting a modular interchangeable test adaptor to a receiver for testing of electronic circuitry connected to the interchangeable test adaptor by test equipment connected to the receiver. The interface connector assembly includes a receiver base having a generally flat surface and a plurality of apertures formed in a predetermined pattern in the surface and a plurality of electrical connectors mounted in the apertures and projecting therefrom. An interchangeable test adaptor is included which has generally flat inner and outer opposing surfaces and a plurality of apertures formed in the interchangeable test adaptor in a predetermined pattern corresponding to the predetermined pattern in the receiver base. The apertures have a plurality of electrical connectors projecting from the inner surface for mating with the electrical connectors in the receiver base and the same electrical connectors projecting from the outer surface for electrical connecting access. A generally circular sleeve is disposed on the receiver base surrounding the predetermined pattern of electrical connectors. The sleeve has an outer wall surface and an inner wall surface configured to receive the interchangeable test adaptor therein. A guide arrangement is provided for retaining the sleeve in axial disposition with respect to the receiver base and permitting rotary motion of the sleeve on the base.

An alignment arrangement is included in the receiver base and the interchangeable test adaptor for aligning the receiver base and the interchangeable test adaptor for axial alignment of the electrical connectors and maintaining the axial alignment while permitting relative movement of the interchangeable test adaptor toward the receiver base to connect the electrical connectors of the adaptor and base.

A cam arrangement is provided for effecting axial movement of the interchangeable test adaptor within the sleeve in response to rotational movement thereof. The cam arrangement comprises a plurality of slots formed in one of the inner wall surface of the sleeve and the interchangeable test adaptor, and cam followers which are mounted on and project from the other of the inner wall surface of the sleeve and the interchangeable test adaptor. The cam followers are adapted to be received in the cam slots when the interchangeable test adaptor is placed within the sleeve. The sleeve is rotatable in one direction to cause the cam follower to move along the inclined portion of the cam slots and thereby move the interchangeable test adaptor axially toward the receiver base causing interconnection of the electrical connectors projecting from the receiver base and the interchangeable test adaptor, and rotatable in an opposite direction to cause disconnection of the connectors.

Preferably, the predetermined pattern of electrical connectors has a generally circular outer extent so as to be confined within the sleeve allowing a maximum number of connectors to be utilized with a minimum sleeve diameter. It is further preferred that the alignment arrangement includes a plurality of alignment pins mounted on one of the receiver base and the interchangeable test adaptor and projecting therefrom. The alignment pins are arranged in a predetermined pattern to align the receiver base and the interchangeable test adaptor for engagement of the electrical connectors, the pattern having the alignment pins asymmetrically disposed with respect to the central axis of the sleeve to assure proper rotational alignment. A plurality of apertures is formed in the other of the receiver base and the interchangeable test adaptor and arranged in a predetermined pattern corresponding with the predetermined pattern of the alignment pins. The apertures are capable of receiving the alignment pins in mating relation therewith, thus maintaining a predetermined alignment of the receiver base and the interchangeable test adaptor and thereby the electrical connectors mounted thereon.

It is preferred that the guide arrangement includes an annular groove formed in the outer wall surface of the sleeve and a plurality of guide rollers mounted to the receiver base surrounding the sleeve for engagement in the annular groove, thereby allowing the sleeve to rotate about its central axis while retaining the sleeve against axial movement thereof. It is further preferred that the guide arrangement includes a releasable latching assembly for releasably latching the sleeve in proper position for insertion of the interchangeable test adaptor. The latch assembly includes a latch pin mounted to the outer wall surface of the sleeve and projecting outwardly therefrom and a latch block mounted to the receiver base adjacent the outer wall surface of the sleeve. The latch block has a slot formed therein for accepting the latch pin in mating relation therewith for engagement thereof upon positioning of the sleeve in proper position for insertion of the interchangeable test adaptor therein. Preferably, the latching arrangement includes a detent assembly mounted on the latch block and engagable with the latch pin to releasably retain the sleeve in alignment with the interchangeable test adaptor for insertion of the interchangeable test adaptor in the sleeve.

It is further preferred that the cam slots include generally axially opening end portions arranged for receiving the followers upon insertion of the interchangeable test adaptor in the sleeve. Additionally, the cam slots include inner end portions extending generally parallel to the flat surface of the receiver base to prevent unintended separation of the receiver base and the interchangeable test adaptor. Further, the cam slots are formed with an axially outwardly enlarged inner end to releasably retain the cam followers and the interchangeable test adaptor in a fully mating position.

The sleeve preferably includes a handle mounted thereto and extending therefrom for manual engagement thereof to effect rotation of the sleeve.

DESCRIPTION OF THE PREFERRED EMBODIMENT

Figure 1:
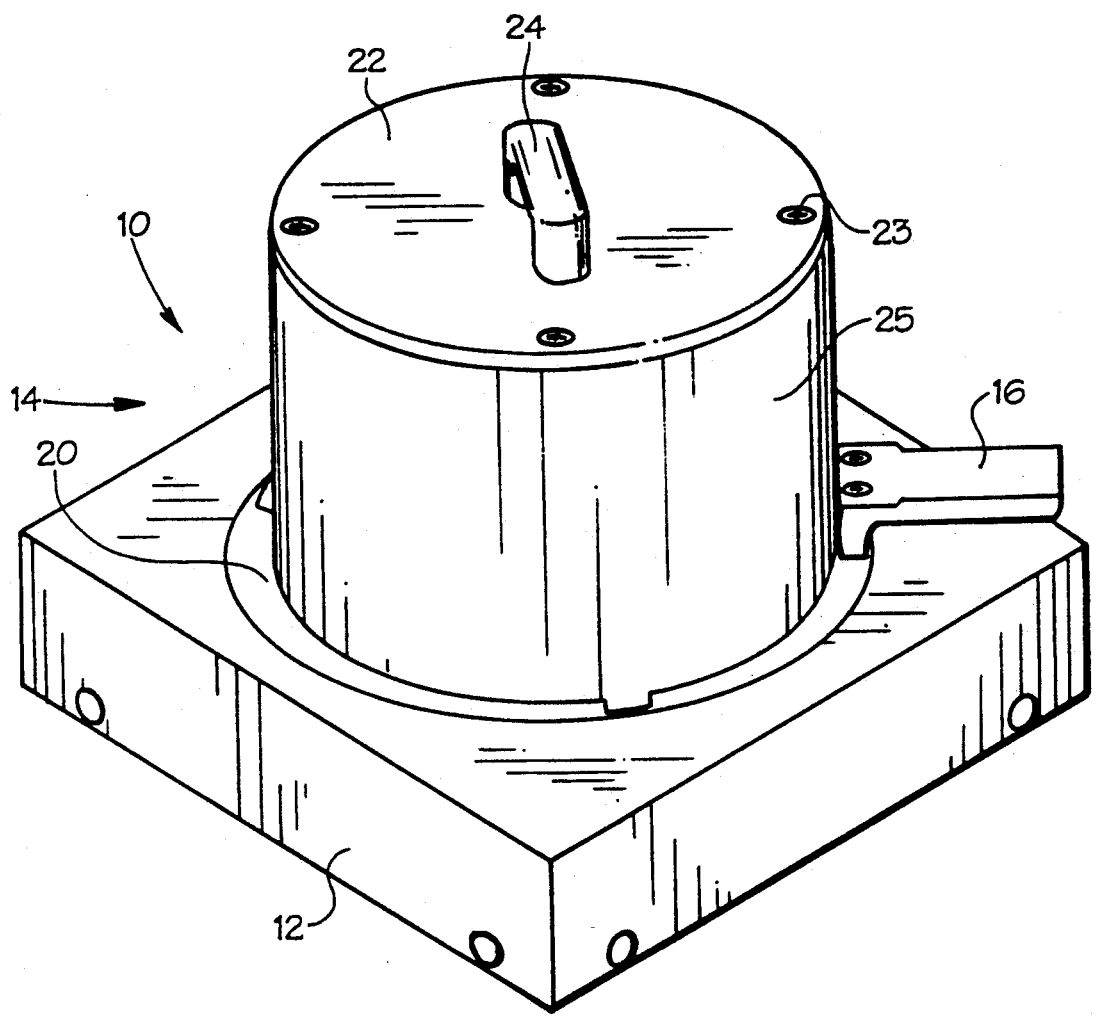
FIG. 1 is a perspective view of an interface connector assembly according to the preferred embodiment of the present invention.

Referring now to the accompanying drawings and particularly FIG. 1, an interface connector assembly according to the preferred embodiment of the present invention is illustrated and indicated generally at 10 and includes a housing 12 containing a cylindrical sleeve 20 having an operational handle 16 attached thereto. A cover 14 is included to provide RF isolation and dust protection while the unit is in use. The cover 14 includes a cylindrical ferrule 25 having a circular flat lid 22 attached thereto with screws 23. A handle 24 is attached to the lid 22, again with screws 23.

As will be explained in greater detail below, the interface connector assembly of the present invention provides an apparatus for mating and unmating electrical connectors 51 of an interchangeable test adaptor 18 (see FIG. 4) with electrical connectors 53 of a receiver base 60 by effecting rotational movement of the sleeve 20 utilizing the operational handle 16.

Figure 2:
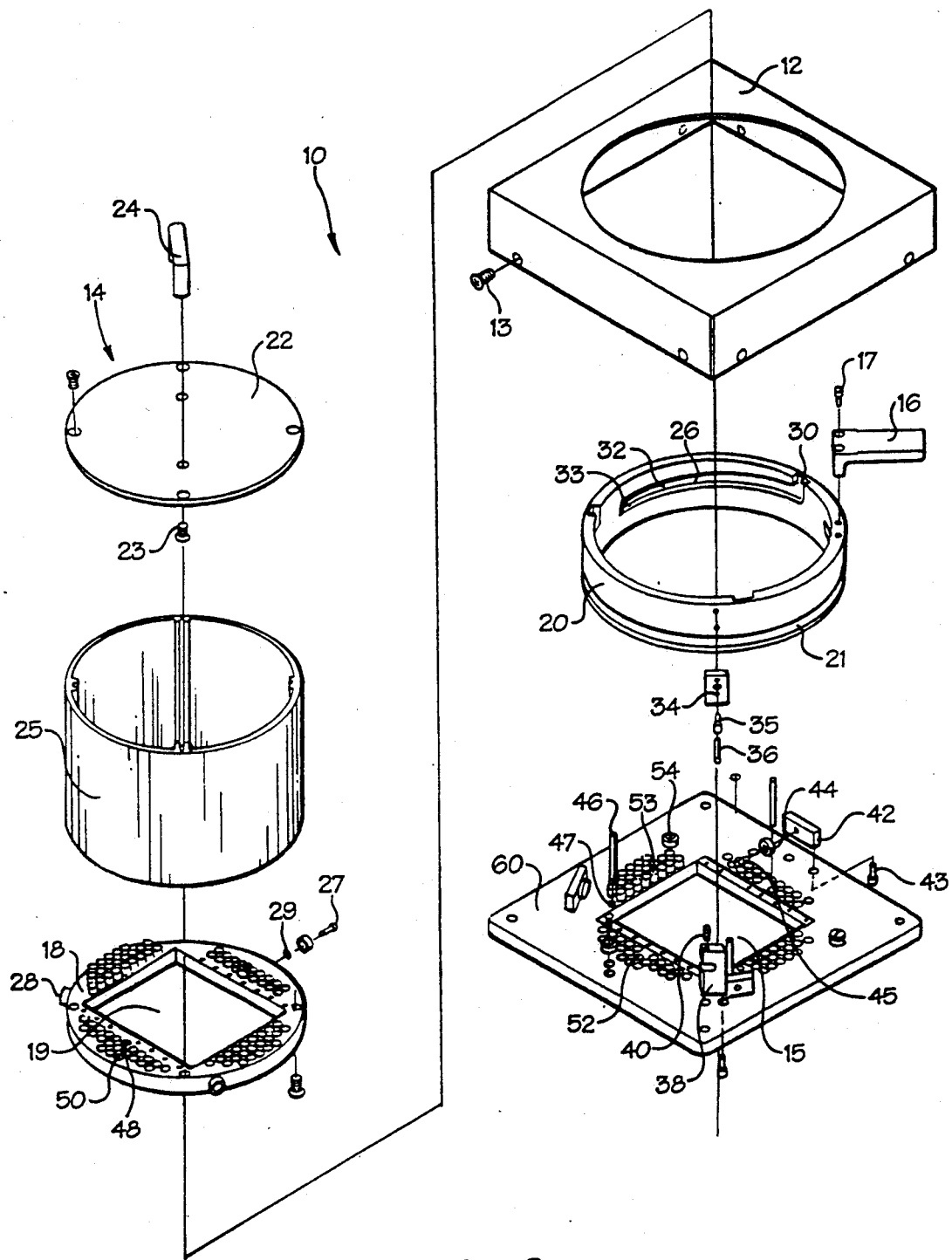
FIG. 2 is an exploded view of the interface connector assembly illustrated in FIG. 1.

As best seen in FIG. 2, the interface connector assembly 10 includes a generally flat, square receiver base 60 to the periphery of which the housing 12 is attached by screws 13 and from which the housing projects to the height of the top of the sleeve 20. The receiver base 60 has a plurality of apertures 52 formed therein, and rectangular opening 15 is formed in the center of the receiver base 60 for mounting electrical connector blocks 58 therein (see FIG. 5). As will be explained presently, the pattern of the aperture 52 arrangement has a generally circular outer extent with the apertures 52 having electrical connectors 53 mounted therein. For clarity, FIG. 2 only shows a portion of the apertures 52 containing electrical connectors 53, while it should be understood that typically all apertures 54 will have electrical connectors 53 mounted therein.

The generally cylindrical sleeve 20 is disposed axially on the receiver base 60 completely surrounding the generally circular predetermined pattern of apertures 52 to maximize the number of apertures 52 that can be located within the confines of the sleeve 20 and thereby minimize the diameter of the sleeve needed to surround a predetermined number of apertures.

Figure 6:
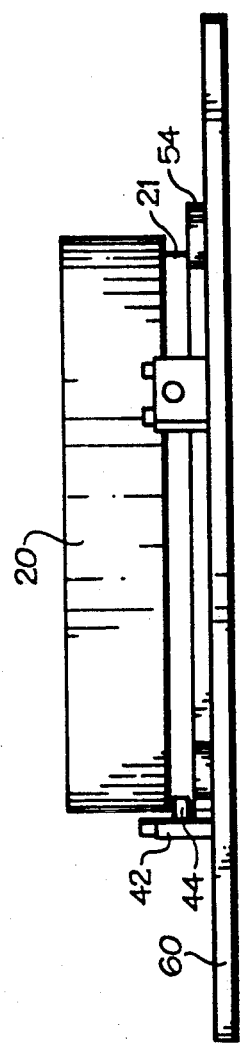
FIG. 6 is a side elevational view of the interface connector assembly of FIG. 1 with the housing and cover removed.

The sleeve 20 is rotatably mounted to the receiver base 60 using a guide arrangement that includes an annular groove 21 formed in the outer wall of the sleeve 20 closely adjacent the receiver base 60. Roller blocks 42 are mounted to the receiver base 60 closely adjacent the annular groove 21 of the sleeve 20 utilizing screws 43. Cylindrical rollers 44 are mounted to the roller block 42 utilizing fasteners 45. The rollers 44 project inwardly toward the central axis of the sleeve 20 and fit within the confines of the groove 21. It should be noted that a multiplicity of rollers 44 may be utilized. However, three rollers 44 are the preferred number which can be used to successfully position the sleeve 20 on the receiver base 60. A plurality of positioning rollers 54 are mounted to the receiver base 60 and positioned directly adjacent the sleeve 20 to allow smooth rotation thereof by positioning the sleeve 20 on receiver base 60 (see FIG. 6).

Referring now to FIG. 2, the guide arrangement also includes a latching assembly having a latch pin 36 mounted to a latch pin plate 34 which is in turn mounted to the outer wall of the cylindrical sleeve 20 using screws 35. The latch pin 36 projects radially outwardly from latch pin plate 34 mounted to the cylindrical sleeve 20. A latch block 38 is mounted to the receiver base 60, closely adjacent the sleeve 20 projecting from the receiver base 60. The latch block 38 has a slot formed therein facing said latch pin 36 for accepting the latch pin 36 in a mating relation therewith. A detent arrangement 40 is mounted on the latch block 38 and engagable with the latch pin 36 to releasably retain the latch pin 36 in mating relation with the latch block 38, thus maintaining the sleeve 20 in alignment with the interchangeable test adaptor 18. The operation of the latching arrangement will be explained hereinafter.

Figure 3:
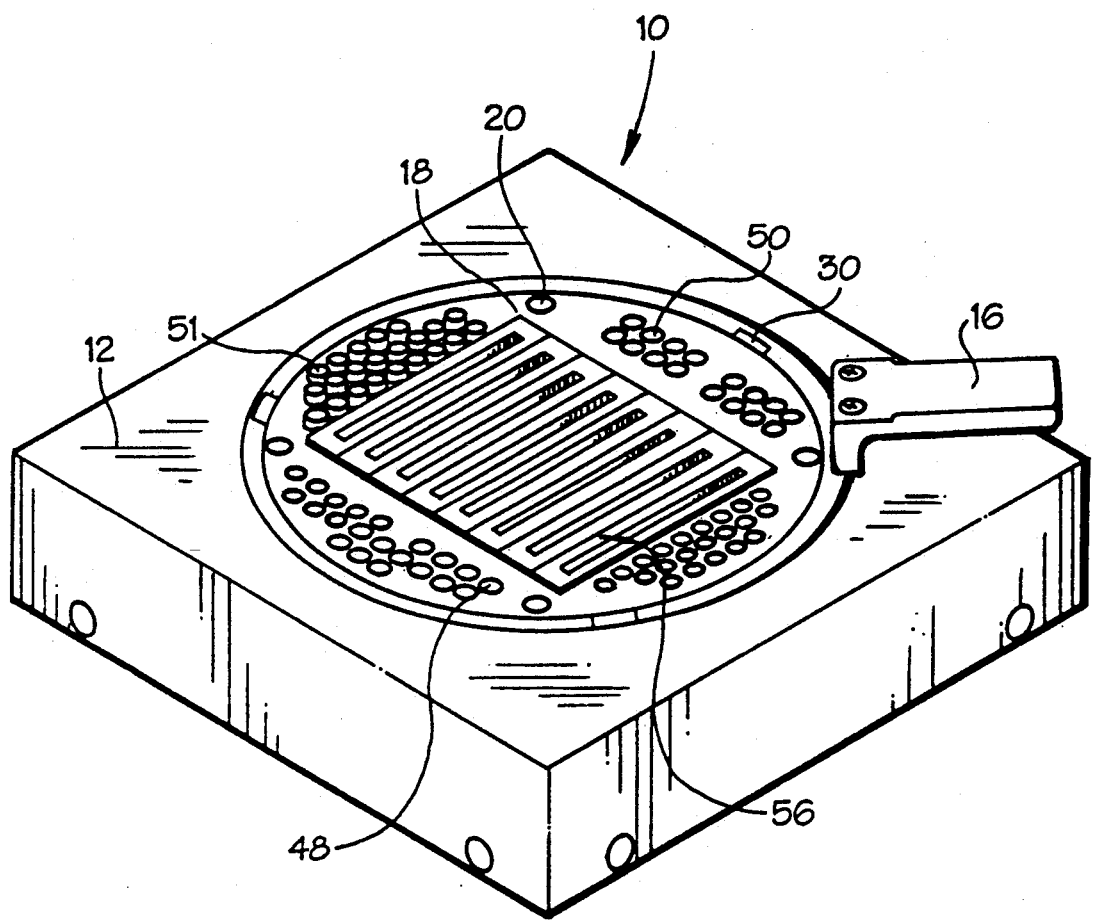
FIG. 3 is a perspective view of the interface connector assembly of FIG. 1 with the lid removed to reveal the interchangeable test adaptor in operative position.
Figure 8:
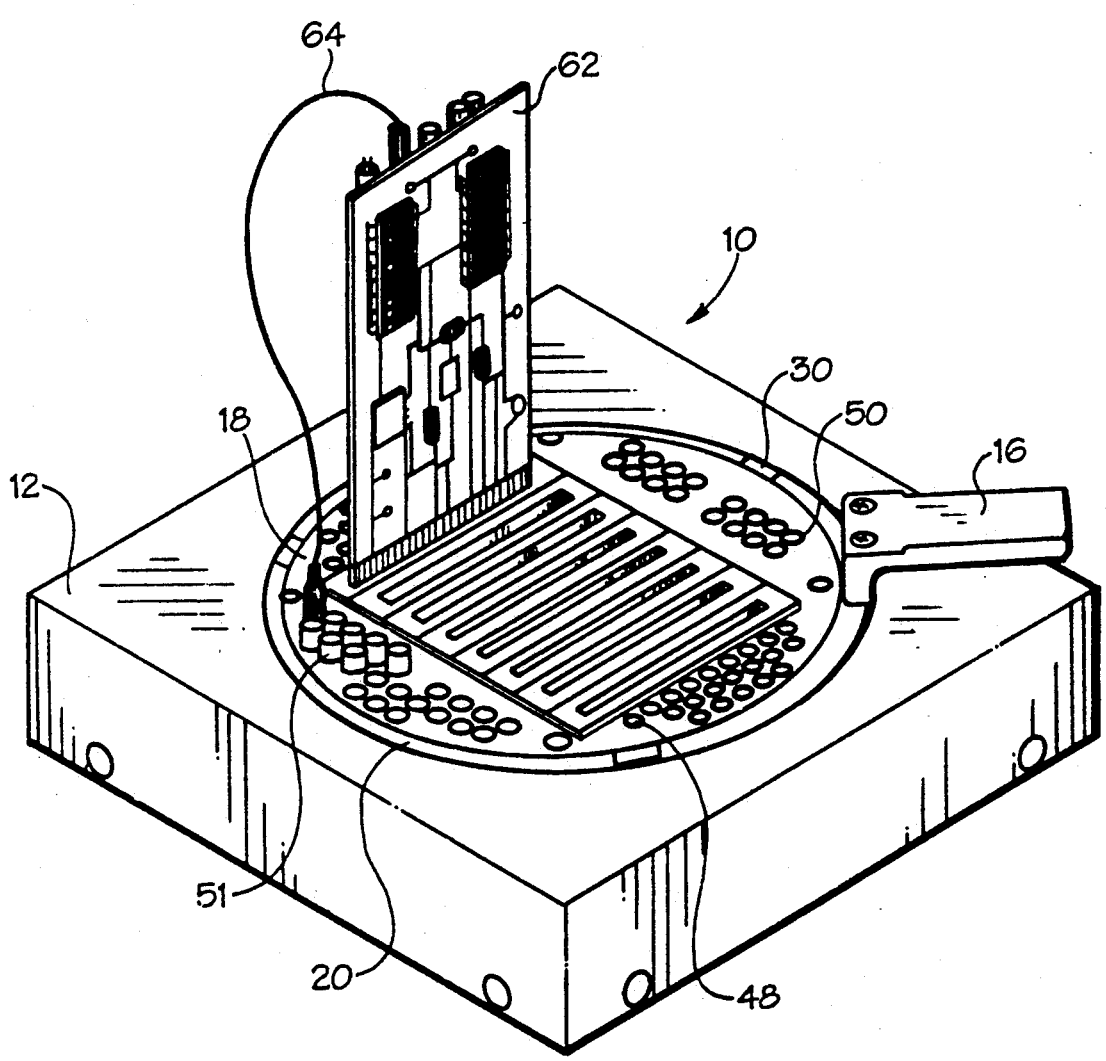
FIG. 8 is a perspective view of the interface connector assembly of FIG. 1 having a circuit board mounted thereto for testing.

An interchangeable test adaptor 18 is provided for electrically connecting a variety of electronic circuit boards to the receiver base 60 for testing. The interchangeable test adaptor 18 has generally flat inner and outer opposing surfaces and is configured to be received within the cylindrical opening of the sleeve 20. A generally rectangular opening 19 is formed in the center of the interchangeable test adaptor 18 corresponding to the opening 15 formed in the receiver base 60. As seen in FIG. 3, electrical connector blocks 56 are mounted within the opening 19 for mounting of electronic circuit boards therein for testing. A plurality of apertures 50 are formed in the interchangeable test adaptor 18 arranged in a predetermined pattern corresponding to the predetermined pattern of apertures 52 formed in the receiver base 60. As best seen in FIG. 8, electrical connectors 51 are mounted in the apertures 50. These connectors 51 pass through the interchangeable test adaptor 18 to mate with the connectors 53 in the receiver base 60 and project upwardly from the interchangeable test adaptor 18 to provide electrical connecting access thereto.

As the interchangeable test adaptor 18 is circular and designed to fit within the sleeve 20, there are any number of ways that the interchangeable test adaptor 18 can be oriented within the sleeve 20. However, there is usually only one way to align the interchangeable test adaptor 18 within the sleeve 20 to achieve proper connection of the electrical connectors 51, 53 associated with the interchangeable test adaptor 18 and the receiver base 60. To this end, an alignment arrangement is provided. More specifically, as best seen in FIG. 2, the alignment arrangement consists of a plurality of vertically upstanding alignment pins 46 secured in the apertures 47 formed in the receiver base 60 and disposed within the perimeter of the sleeve 20 in an asymmetrical predetermined pattern with respect to the central axis of the sleeve 20. Apertures 48 are formed in the interchangeable test adaptor in a predetermined pattern corresponding to the pattern of the alignment pins 46. The alignment pins 46 upstanding from the receiver base 60 mate with the alignment holes 48 within the interchangeable test adaptor 18 whenever the interchangeable test adaptor 18 is placed within the sleeve 20 in proper alignment. This operation will be explained in more detail below.

Figure 7:
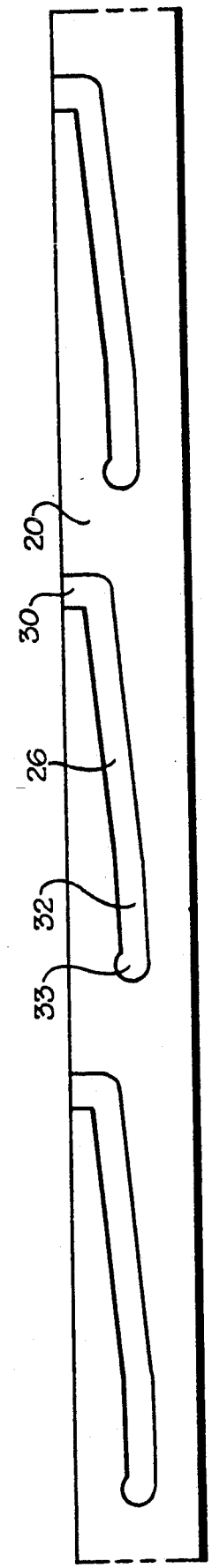
FIG. 7 is a development of the inner surfaces of the sleeve illustrated in FIG. 2, revealing the cam slots according to the preferred embodiment of the present invention.

In order to effect axial movement of the interchangeable test adaptor toward and away from the receiver base 60 upon rotation of the sleeve 20, a cam arrangement is provided. With reference to FIG. 2, the cam consists of three inclined slots 26 formed in the inner wall of the sleeve 20. Three cam followers 28 are mounted on the periphery of the interchangeable test adaptor 18 using press pins 27 and washers 29. Each cam slot 26 includes a generally axially opening end portion 30 for receipt of the cam followers 28 upon insertion of the interchangeable test adaptor 18 in the sleeve 20. Each cam slot 26 also includes an inner end portion 32 extending generally parallel to the flat surface of the receiver base 60 to prevent unintended separation of the receiver base 60 and the interchangeable test adaptor 18 after full insertion of the interchangeable test adaptor 18 in the sleeve 20. Each cam slot 26 is formed with an axially outwardly enlarged inner end 33 to releasably retain the cam followers 28 and the interchangeable test adaptor 18 in fully mating position. As best seen in the development view of FIG. 7, the inclined cam slots 26 are oriented so that when the interchangeable test adaptor 18 is inserted within the sleeve such that the followers 28 are inserted within the slots 26 and the sleeve 20 is rotated on the receiver base 60 the inclined portion of the cam slots 26 will move the cam followers 28 axially downwardly, thereby driving the interchangeable test adaptor 18 axially toward the receiver base 60 thereby driving the electrical connectors on the interchangeable test adaptor 18 and the receiver base 60 into mating relation.

Figure 4:
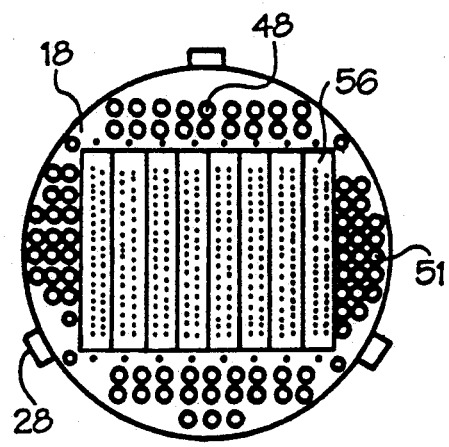
FIG. 4 is a top plan view of the interface connector assembly illustrated in FIG. 1 with the cover and interchangeable test adaptor removed.
Figure 5:
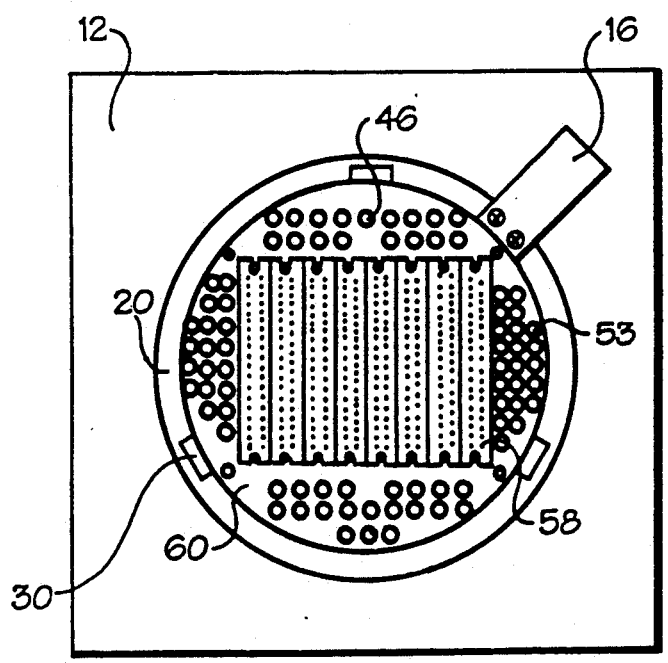
FIG. 5 is a bottom view of the interchangeable test adaptor of the present invention illustrated in FIG. 2.

Operation of the interface connector assembly 10 is generally as follows. With reference to FIG. 4, a plurality of electrical connector blocks 56 are mounted within the rectangular opening 19 that is within the circular periphery of the interchangeable test adaptor 18. Connector pins project outwardly from the connector blocks 56. With reference to FIG. 5, similar electrical connector blocks 58 are mounted to the receiver base 60 within the predetermined pattern of electrical connectors 53 mounted in the receiver base 60. The connector blocks 58 in the receiver base 60 are configured to accept the pins projecting from the connector blocks 56 in the interchangeable test adaptor 18. Similarly, the electrical connectors 53 mounted in the receiver base 60 are configured to accept the electrical connectors 51 mounted in the interchangeable test adaptor 18.

The interchangeable test adaptor 18 is placed within the sleeve 20 such that the alignment pins 46 projecting from the receiver base 60 are mated with the alignment apertures 48 in the interchangeable test adaptor 18. This will ensure proper alignment of the interchangeable test adaptor 18 and the receiver base 60 for proper mating of the electrical connectors 51, 53. With the proper alignment pin 46 orientation, the cam followers 28 will be received by the open end portions 30 of the inclined cam slots 26 within the sleeve 20. To further ensure proper alignment, the latch pin 36 must be mated with the slot in the latch block 38 such that the detent 40 releasably retains the latching pin 36, thereby locating the sleeve 20 in the initial loading position. With the interchangeable test adaptor 18 in the initial loading position, the sleeve 20 is rotated clockwise utilizing the handle 16. This causes the cam slots 26 to rotate to cause the inclined portions to move the cam followers 28 axially downwardly and thereby drive the interchangeable test adaptor 18 axially downwardly towards the receiver base 60, thus mating the electrical connectors 53 mounted on the receiver base 60 with the electrical connectors 51 mounted on the interchangeable test adaptor 18 as well as the connector blocks 58 mounted on the receiver base 60 with the connector blocks 56 mounted on the interchangeable test adaptor 18.

When the followers reach the inner portion 32 of the cam slots 26, electrical connection will have been made and the followers 28 will rest in the inner portions 32 of the slots 26 which are parallel to the receiver base 60. The enlarged inner ends 33 will cause the cam followers 28 to snap into position. The inner ends 33 will releasably retain the cam followers 28 and the interchangeable test adaptor 18 in a fully mating position. Any resistive force from the electrical connectors trying to force the interchangeable test adaptor 18 away from the receiver base 60 will be countered by a normal force directed downwardly from the parallel portions 32 of the slots 26 thereby preventing unintentional opening movement of the interchangeable test adaptor 18 which would otherwise occur if the cam followers 28 were in the inclined portions of the slots 26 rather than the parallel portions 32. As such, the parallel portions 32 of the cam slots 26 mainrain the electrical connectors in mating relation. The result of this operation is best il in FIG. 3.

With to FIG. 8, an electrical circuit board 62 is mounted within a block 56 on the interchangeable rest adaptor 18. This the connectors on the circuit board 62 in electrical contact the electronic test equipment (not shown) attached to the boards 58 in the receiver base 60. At the option of the technician, various signals can be taken from the electrical connectors 50 projecting from the interchangeable test adaptor 18 using jumper wires 64. By utilizing the interface connector assembly of the present invention, electrical circuit boards can be provided with normal operating conditions through the connector blocks 56 and various test configurations may be arranged utilizing the electrical connectors 50 and jumper wires 64.

Once testing is complete, the handle 16 is utilized to rotate the sleeve 20 in the opposite (counterclockwise) direction, causing the inclined slots 26 to move the cam followers 28 axially outwardly and thereby disconnect the electrical connection and ultimately position the interchangeable test adaptor 18 for removal from the sleeve 20.

From the foregoing, it is apparent that the interface connector assembly of the present invention provides the mechanical advantage necessary to effect connection of the electrical connectors of the interchangeable test adaptor and receiver base in a simple, compact arrangement that obviates the need for any complicated gear and lever mechanism or other multiplicity of moving parts and that does not require significant space beyond the space needed for the connectors, which are compactly located in a circular pattern that allows the sleeve to occupy a minimum of space.

It will therefore be readily understood by those persons skilled in the art that the present invention is susceptible of a broad utility and application. Many embodiments and adaptations of the present invention other than those herein described, as well as many variations, modifications and equivalent arrangements will be apparent from or reasonably suggested by the present invention and the foregoing description thereof, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

I claim:

1. An interface connector assembly for use in interconnecting a modular interchangeable test adaptor to a receiver for testing of electronic circuitry connected to the interchangeable test adaptor by test equipment connected to the receiver, said interface connector assembly comprising;

a receiver base having a generally flat surface, a plurality of apertures formed in a predetermined pattern in said surface, and a plurality of first electrical connectors mounted in and projecting from said surface;

an interchangeable test adaptor having generally flat inner and outer opposing surfaces and a plurality of apertures formed in said interchangeable test adaptor in a predetermined pattern corresponding to said predetermined pattern in said receiver base, said apertures having a plurality of second electrical connectors projecting from said inner surface for mating with said first electrical connectors, said second electrical connectors projecting from said outer surface for electrical connecting access;

a generally cylindrical sleeve disposed on said receiver base and surrounding said predetermined pattern of first electrical connectors, said sleeve having an outer wall surface and an inner wall surface configured to receive said interchangeable test adaptor therein;

guide means for retaining said sleeve in axial disposition with respect to said receiver base and permitting rotating motion of said sleeve on said base, said guide means including an annular groove formed in said outer wall surface and a plurality of guide rollers mounted to said receiver base and surrounding said sleeve for engagement in said annular groove, thereby allowing said sleeve to rotate about its central axis while retaining said sleeve against axial movement;

alignment means mounted on one of said receiver base and said interchangeable test adaptor for aligning said receiver base and said interchangeable test adaptor for axial alignment of said first electrical connectors with said second electrical connectors and maintaining said axial alignment while permitting relative movement of said interchangeable test adaptor toward said receiver base to connect said first electrical connectors with said second electrical connectors;

cam means for effecting axial movement of said interchangeable test adaptor within said sleeve, in response to rotational movement of said sleeve, said cam means comprising a plurality of slots formed in said inner wall surface of said sleeve and cam followers mounted on and projecting from said interchangeable test adaptor, said cam followers adapted to be received in said cam slots when said interchangeable test adaptor is placed within said sleeve, said sleeve being rotatable in one direction to cause the cam followers to move along said inclined portion of said cam slots and thereby move said interchangeable test adaptor axially toward said receiver base, causing interconnection of said first electrical connectors and said second electrical connectors, and rotatable in an opposite direction to cause disconnection of said first and said second electrical connectors.

2. An interface connector assembly according to claim 1 wherein said cam slots are formed with an axially outwardly enlarged inner end to releasably retain said cam followers and said interchangeable test adaptor in a fully mating position.

3. An interface connector assembly according to claim 1 wherein said predetermined pattern of said electrical connectors has a generally circular outer extent so as to be confined within said sleeve thereby allowing a maximum number of connectors to be utilized with a minimum sleeve diameter.

4. An interface connector assembly according to claim 1 wherein said alignment means includes a plurality of alignment pins mounted on one of said receiver base and said interchangeable test adaptor and projecting therefrom, said alignment pins being arranged in a predetermined pattern to align said receiver base and said interchangeable test adaptor for engagement of said electrical connectors, said predetermined pattern having said alignment pins asymmetrically disposed with respect to the central axis of said sleeve, and a plurality of apertures formed in the other of said receiver base and said interchangeable test adaptor and arranged in a predetermined pattern corresponding with said predetermined pattern of said alignment pins, said apertures being capable of receiving said alignment pins in mating relation therewith, thus maintaining a predetermined alignment of said receiver base and said interchangeable test adaptor and thereby said electrical connectors mounted thereon.

5. An interface connector assembly according to claim 1 wherein said guide means includes releasable latching means for releasably latching said sleeve in proper position for insertion of said interchangeable test adaptor in said receiver base with said interchangeable test adaptor and said receiver base aligned.

6. An interface connector assembly according to claim 5 wherein said latching means includes a latch pin mounted to said outer wall surface of said sleeve and projecting outwardly therefrom and a latch block mounted to said receiver base adjacent said outer wall surface of said sleeve, said latch block having a slot formed therein for accepting said latch pin in mating relation therewith, for engagement thereof upon positioning of said sleeve in proper position for insertion of said interchangeable test adaptor therein.

7. An interface connector assembly according to claim 6 wherein said latching means includes detent means mounted on said latch block and engagable with said latch pin for releasably retaining said sleeve in alignment with said interchangeable test adaptor for insertion of said interchangeable test adaptor in said sleeve.

8. An interface connector assembly according to claim 1 wherein said cam slots include a generally axially opening end portion arranged for receiving said followers upon insertion of said interchangeable test adaptor in said sleeve.

9. An interface connector assembly according to claim 1 wherein said cam slots include inner end portions extending generally parallel to said flat surface of said receiver base to prevent unintended separation of said receiver base and said interchangeable adaptor.

10. An interface connector assembly according to claim 9 wherein said cam slots are formed with an axially outwardly enlarged inner end to releasably retain said cam followers and said interchangeable test adaptor in a fully mating position.

11. An interface connector assembly according to claim 1 wherein said sleeve includes a handle mounted thereto and extending therefrom for manual engagement thereof to effect rotation of said sleeve.

* * * * *

UNITED STATES PATENT AND TRADEMARK OFFICE
CERTIFICATE OF CORRECTION

PATENT NO. : 5,215,476

DATED : June 1, 1993

INVENTOR(S) : Lewis T. Rector

It is certified that error appears in the above-identified patent and that said Letters Patent is hereby corrected as shown below:

Column 7, line 54, delete "mainrain" and insert therefor -- maintain --.

Column 7, line 55, delete "il" and insert therefor -- illustrated --.

Column 7, line 57, after "With" insert -- reference --.

Column 7, line 58, after "a" insert -- connector --.

Column 7, line 58, delete "rest" and insert therefor -- test --.

Column 7, line 59, after "This" insert -- places --.

Column 7, line 60, after "contact" insert -- with --.

Column 7, line 61, after "attached to the" insert -- connector --.

Signed and Sealed this

Twenty-second Day of February, 1994

*Attest:*

BRUCE LEHMAN

*Attesting Officer*  *Commissioner of Patents and Trademarks*